United States Patent
Oh et al.

(10) Patent No.: US 8,106,714 B2
(45) Date of Patent: Jan. 31, 2012

(54) ADJUSTABLE CAPACITOR, DIGITALLY CONTROLLED OSCILLATOR, AND ALL-DIGITAL PHASE LOCKED LOOP

(75) Inventors: Do-hwan Oh, Seoul (KR); Kyo-Jin Choo, Seoul (KR); Deog-Kyoon Jeong, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 62 days.

(21) Appl. No.: 12/630,885

(22) Filed: Dec. 4, 2009

(65) Prior Publication Data

US 2010/0156550 A1 Jun. 24, 2010

Related U.S. Application Data

(60) Provisional application No. 61/139,063, filed on Dec. 19, 2008.

(30) Foreign Application Priority Data

Aug. 19, 2009 (KR) ........................ 10-2009-0076788

(51) Int. Cl.
H03L 7/02 (2006.01)
H03B 5/12 (2006.01)

(52) U.S. Cl. .................. 331/36 C; 331/117 R; 331/181; 307/109

(58) Field of Classification Search .................... 331/34, 331/36 C, 36 L, 117 FE, 117 R, 167, 181; 307/109
See application file for complete search history.

(56) References Cited

U.S. PATENT DOCUMENTS

| | | | |
|---|---|---|---|
| 6,268,776 B1 * | 7/2001 | Faison et al. | 331/116 FE |
| 6,734,741 B2 * | 5/2004 | Staszewski et al. | 331/36 C |
| 6,870,434 B2 * | 3/2005 | Han et al. | 331/158 |
| 7,187,240 B2 * | 3/2007 | Cathelin et al. | 331/2 |
| 7,764,127 B2 * | 7/2010 | Sun et al. | 331/36 C |
| 7,812,678 B2 * | 10/2010 | Moussavi | 331/25 |

* cited by examiner

*Primary Examiner* — Levi Gannon
(74) *Attorney, Agent, or Firm* — Sughrue Mion, PLLC

(57) ABSTRACT

An adjustable capacitor is provided including a capacitor unit including a plurality of capacitor groups aligned in a matrix format and a switch unit to adjust capacitance by connecting the plurality of capacitor groups in parallel according to a selection signal of a column and row of the matrix. Accordingly, the adjustable capacitor may be realized of a small size but with a high capacitance change rate.

18 Claims, 9 Drawing Sheets

ADJUSTABLE CAPACITOR, DIGITALLY CONTROLLED OSCILLATOR, AND ALL-DIGITAL PHASE LOCKED LOOP

CROSS-REFERENCE TO RELATED APPLICATIONS

This application claims priority under 35 U.S.C. §119 from Korean Patent Application No. 10-2009-0076788, filed on Aug. 19, 2009, in the Korean Intellectual Property Office, and U.S. Provisional Application No. 61/139,063, filed on Dec. 19, 2009, the disclosure of which is incorporated herein by reference in its entirety.

BACKGROUND OF THE INVENTION

1. Field of the Invention

Apparatuses and methods consistent with the present invention relate to an adjustable capacitor, a digitally controlled oscillator, and an all-digital phase locked loop, and more particularly, to an adjustable capacitor which connects a plurality of capacitor groups in a matrix form and selectively connects each capacitor group in parallel so as to adjust capacitance, and a digitally controlled oscillator and an all-digital phase locked loop using the same.

2. Description of the Related Art

Recently, high-definition television (HDTV) has been growing in popularity, and digital TV has been very much improved. However, since there are various digital TV standards, an analog TV standard has been still used widely. Accordingly, TV manufacturers request a design that could cover those various standards. However, it was not easy to have a TV tuner that can support various TV standards such as NTSC, PAL, ATSC and DVB using VHF/UHF/frequencies within the range of 40 MHz~900 MHz.

In particular, it was difficult to embody a frequency synthesizer among TV tuner components that satisfies phase noise specifications within a wide frequency range. Accordingly, a sophisticated adjustable technology which can adjust to various frequency ranges was required.

A conventional analog PLL has a limited adjustable range, however the coefficient of all digital filters of an all-digital phase-locked loops (ADPLLs) circuit is programmable and thus the ADPLLs circuit is more appropriate and satisfies the above requirements better. In addition, if the ADPLLs circuit is used, the problem of low supply voltage and high leakage current occurring while an analog circuit is integrated may be overcome.

A digitally controlled oscillator (DCO) is a main component of ADPLLs and determines a frequency tuning range and phase noise performance of all systems. Conventionally, a plurality of oscillators are used to support broadband, but such embodiment causes product cost to increase and design efficiency to be reduced due to space restriction. Accordingly, a digitally controlled oscillator that supports broadband using a single LC circuit and satisfies phase noise specification is required.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

The present disclosure provides an adjustable capacitor which could increase a capacitance change rate while maintaining a small size, and a digitally controlled oscillator and an all-digital phase locked loop using the same.

An adjustable capacitor, according to an exemplary embodiment of the present invention, comprises a capacitor unit to include a plurality of capacitor groups aligned in a matrix format and a switch unit to adjust capacitance by connecting the plurality of capacitor groups in parallel according to a selection signal of a column and row of the matrix, and in each of the capacitor group, capacitance may be adjusted by a first capacity unit and the capacitance may be adjusted by a second capacity unit which is smaller than the first capacity unit, according to an external control signal.

Each of the capacitor group may comprise a first capacitor sub-group having a first capacitance, a second capacitor sub-group having capacitance different from a first capacitance, and a selection unit to alternately connect the first capacitor sub-group and the second capacitor sub-group with a switch element of the switch unit corresponding to the capacitor group according to an external control signal.

The selection unit may disconnect the second capacitor sub-group from the switch element if the first capacitor sub-group is connected to the switch, and disconnect the first capacitor sub-group from the switch element if the second capacitor sub-group is connected to the switch element while maintaining connection of the first capacitor sub-group corresponding to a selection signal with respect to the capacitor group.

The adjustable capacitor further comprises an adjustment unit to select a plurality of capacitor groups to be connected in parallel according to a required capacitance size and generate a selection signal of a column and row of the matrix corresponding to the selected plurality of capacitor groups.

A digitally controlled oscillator, according to an exemplary embodiment of the present invention, comprises an inductor, an adjustable capacitor to adjust capacitance by selectively connecting a plurality of capacitor groups aligned in a matrix format in parallel and a control unit to control oscillation frequency by adjusting capacitance of the adjustable capacitor and inductance of the inductor, and in each of the capacitor group, capacitance may be adjusted by a first capacity unit and the capacitance may be adjusted by a second capacity unit which is smaller than the first capacity unit, according to an external control signal.

Each of the capacitor group may comprise a first capacitor sub-group having a first capacitance, a second capacitor sub-group having capacitance different from a first capacitor, and a selection unit to alternately connect the first capacitor sub-group and the second capacitor sub-group with a switch element corresponding to the capacitor group.

The selection unit may disconnect the second capacitor sub-group from the switch element if the first capacitor sub-group is connected to the switch, and disconnect the first capacitor sub-group from the switch element if the second capacitor sub-group is connected to the switch element while maintaining connection of the first capacitor sub-group corresponding to a selection signal with respect to the capacitor group.

The control unit may select a plurality of capacitor groups to be connected in parallel according to a required capacitance size and generate a selection signal of a column and row of the matrix corresponding to the selected plurality of capacitor groups.

An all-digital phase locked loop, according to an exemplary embodiment of the present invention, comprises a digitally controlled oscillator to adjust oscillation frequency by changing connection state of a plurality of capacitor groups aligned in a matrix format, a detection unit to compare oscillation frequency output from the digitally controlled oscillator with standard frequency, and detect phase difference and frequency difference between the two frequencies, and a digital loop filter to provide a digital control signal with respect to the digitally controlled oscillator based on the detected phase difference and frequency difference, and in each of the capacitor group, capacitance may adjusted by a first capacity unit and the capacitance may be adjusted by a second capacity unit which is smaller than the first capacity unit, according to an external control signal.

The digitally controlled oscillator comprises an inductor, an adjustable capacitor to adjust capacitance by selectively connecting a plurality of capacitor groups aligned in a matrix format in parallel, and a control unit to control oscillation frequency by adjusting capacitance of the adjustable capacitor and inductance of the inductor according to the digital control signal.

The capacitor group comprises a first capacitor sub-group having a first capacitance, a second capacitor sub-group having capacitance different from a first capacitor, and a selection unit to alternately connect the first capacitor sub-group and the second capacitor sub-group with a switch element corresponding to the capacitor group.

The selection unit may disconnect the second capacitor sub-group from the switch element if the first capacitor sub-group is connected to the switch, and disconnect the first capacitor sub-group from the switch element if the second capacitor sub-group is connected to the switch element while maintaining connection of the first capacitor sub-group corresponding to a selection signal with respect to the capacitor group.

The control unit may select a plurality of capacitor groups to be connected in parallel according to the digital control signal and generate a selection signal of a column and row of the matrix corresponding to the selected plurality of capacitor groups.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS

Figure 1:
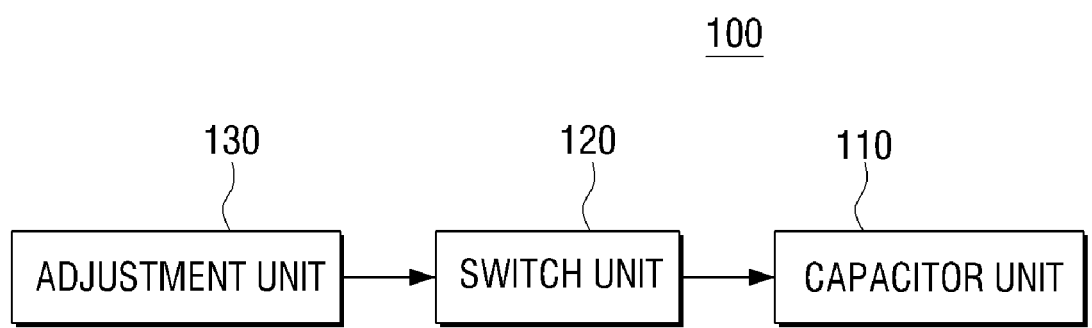
FIG. 1 is a block diagram illustrating the structure of an adjustable capacitor according to an exemplary embodiment of the present invention.

Certain exemplary embodiments will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the invention. Thus, it is apparent that the present invention can be carried out without those specifically defined matters. Also, well-known functions or constructions are not described in detail since they would obscure the invention with unnecessary detail.

FIG. 1 is a block diagram illustrating the structure of an adjustable capacitor 100 according to an exemplary embodiment of the present invention. Referring to FIG. 1, the adjustable capacitor 100 comprises a capacitor unit 110, a switch unit 120, and an adjustment unit 130.

The capacitor unit 110 includes a plurality of capacitor groups aligned in a matrix format. Specifically, the capacitor unit 110 may include a plurality of capacitor groups aligned in a matrix format having a plurality of columns and rows. Each capacitor group may include only a single capacitor or may include a plurality of capacitors with different capacitances. In addition, capacitance of each capacitor group may be adjusted by the combination of a first capacitance unit and a second capacitance unit which is smaller than the first capacitance unit according to an external control signal. One end of the capacitor in a capacitor group may be connected to a first common node (Clk) and the other end may be connected to a second common node (Clkb).

The first common node (Clk) and the second common node (Clkb) represent an output terminal of the adjustable capacitor 100 according to an exemplary embodiment of the present invention. Accordingly, the capacitor 100 has the value of capacitance which varies according to connection state of the first common node (Clk) and the second common node (Clkb) of the plurality of capacitors.

The switch unit 120 may adjust capacitance of the adjustable capacitor 100 by connecting a plurality of capacitor groups in parallel according to a selection signal of the column and row with respect to a matrix. Specifically, the switch unit 120 may adjust capacitance of the adjustable capacitor 100 by changing connection state of each capacitor group according to a selection signal of the column and row with respect to a matrix. For instance, if a selection signal is applied to a single capacitor group, the switch unit 120 may control the connection state so that a capacitor of the capacitor group has a capacitance value with respect to the first common node and the second common node. On the other hand, if a selection signal is not applied to a single capacitor group, the switch unit 120 changes the connection state so that a capacitor in the capacitor group does not have a capacitance value with respect to the first common node and the second common node.

A capacitor is an element that stores an electric field in a space between two conductors, and a capacitance value increases when the capacitor is connected in parallel differently from a resistance element. Accordingly, if a plurality of capacitors are connected in parallel sequentially, a capacitance value may increase step by step. In this case, as the number of connected capacitors increases, an adjustable capacitor having a more linear capacitance value may be realized.

However, if the number of connected capacitors increases, the number of wires which connect each capacitor in parallel increases, and the number of parasite capacitors also increases. If the number of parasite capacitors increase, the range in which capacitance change is reduced.

Figure 2:
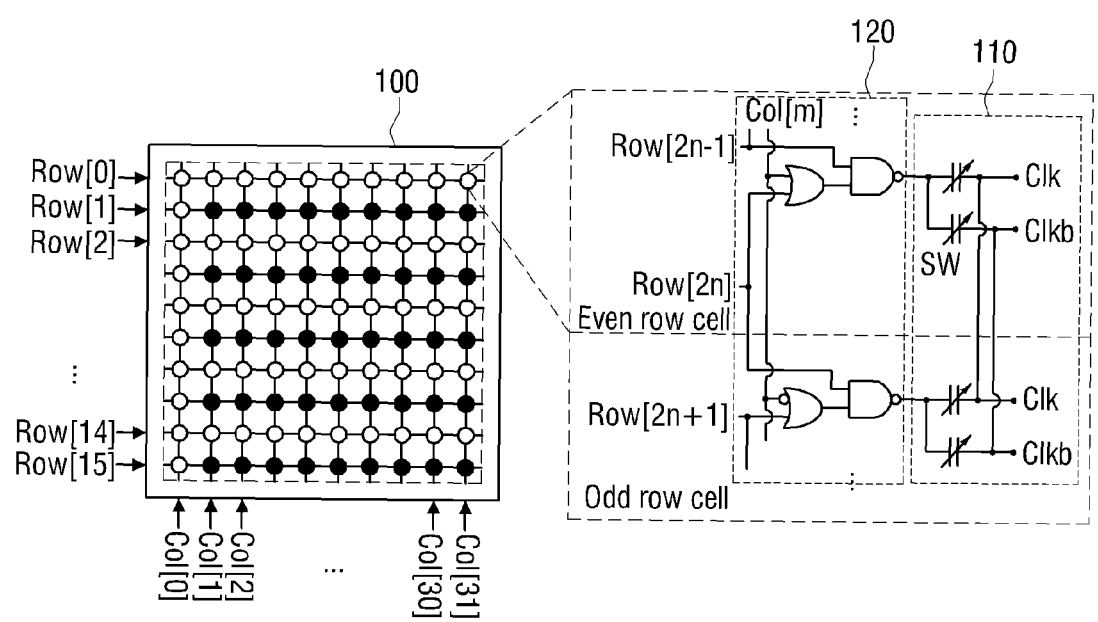
FIG. 2 is a detailed circuit diagram illustrating the structure of the capacitor unit in FIG. 1 and a switch unit.

Therefore, the adjustable capacitor 100, according to an exemplary embodiment of the present invention, is disposed in a matrix format having a plurality of columns and rows as illustrated in FIG. 2. As plurality of capacitors are disposed in a matrix format, the number of wires used to connect the plurality of capacitors and the first and second common nodes may be reduced, and the size of parasite capacitance may also be reduced.

Figure 3:
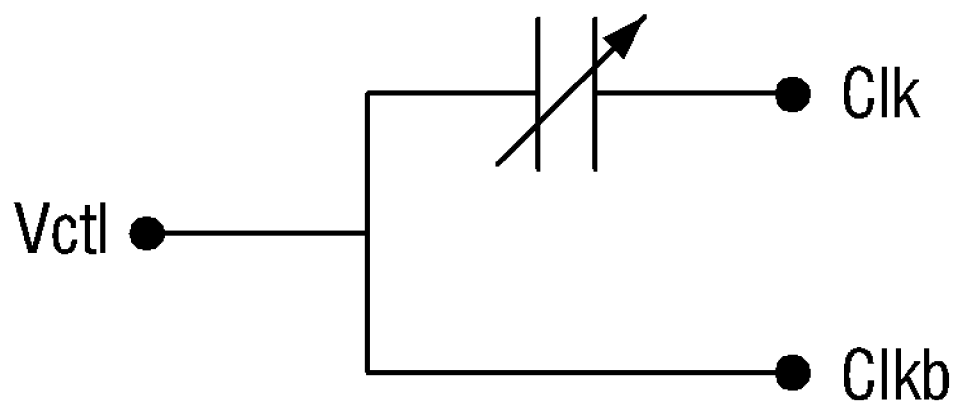
FIG. 3 is a circuit diagram provided to explain the operation of the adjustable capacitor in FIG. 1.

The switch unit 120 may be realized as being included in the capacitor unit 110. Specifically, if each of a plurality of capacitor groups in the capacitor unit 110 is realized as illustrated in FIG. 3, that is, if each capacitor is realized as a varistor, a capacitance value of the varistor may vary according to a control signal (Vctl) without including a separate switch unit.

The adjustment unit 130 may select a plurality of capacitor groups to be connected in parallel according to a required capacitance size, and generate a selection signal of the column and row of a matrix corresponding to the selected plurality of capacitor groups. Specifically, if the plurality of capacitors have the same capacitance, the capacitance of the adjustable capacitor 100 increases in proportion to the number of capacitors connected in parallel. Accordingly, the adjustment unit 130 may calculate the number of capacitors to be connected in parallel according to a required capacitance size, and select a plurality of capacitor groups in a matrix corresponding to the calculated number of capacitors.

FIG. 2 is a detailed circuit diagram illustrating the structure of the capacitor unit 110 in FIG. 1 and the switch unit 120.

Referring to FIG. 2, the capacitor unit 110 includes 512 (16*32) number of capacitor groups, and those 512 capacitor groups are disposed in a matrix format having 16 columns and 32 rows. Each capacitor group includes 2 capacitors, one end of one capacitor is connected to the first common node (Clk) and one end of the other capacitor is connected to the second common node (Clkb), and the two capacitors which are not connected to the common nodes are connected with each other to a switch (SW). In the exemplary embodiment of the present invention, two capacitors are used for each cell (each capacitor group), but only one capacitor may be used for each cell or more than 2 capacitors may be used.

The switch unit 120 receives a selection signal of a column (col [0]~col [31]) and row (Row [0]~Row [15]) of a matrix. Specifically, the switch unit 120 may determine whether a cell is selected using two logic elements for each cell in the matrix. Since the operation of selecting a capacitor group (cell) in the matrix is similar to that of selecting a cell in a general memory element, detailed description regarding this will be omitted. In the exemplary embodiment of the present invention, the switch unit 120 may use AND and OR logic elements, but the switch unit 120 may use another element or may be realized in another format.

The switch unit 120 changes connection state of a capacitor in a capacitor group (cell) with respect to a capacitor group (cell) which received a selection signal. The operation of the switch unit 120 will be explained with reference to FIG. 3.

FIG. 3 is a circuit diagram illustrating connection state of a capacitor according to the operation of the switch unit 120 in FIG. 2.

Referring to FIG. 3, if a selection signal with respect to the capacitor group (cell) is received (Vclt≠'0'), the capacitor of the capacitor group (cell) may receive electric charge from a Vclt node or maintain a current electric charge. Accordingly, a capacitance value is obtained with respect to the first common node (Clk) and the second common node (Clkb).

On the other hand, if a selection signal with respect to the capacitor group (cell) is not received (Vclt='0'), the electric charge in a capacitor of the capacitor group (cell) is discharged to a Vctl node. Accordingly, there is no capacitance value with respect to the first common node (Clk) and the second common node (Clkb).

Therefore, the adjustable capacitor 100, according to an exemplary embodiment of the present invention, may have high capacitance change rate with low parasite capacitance.

Figure 4:
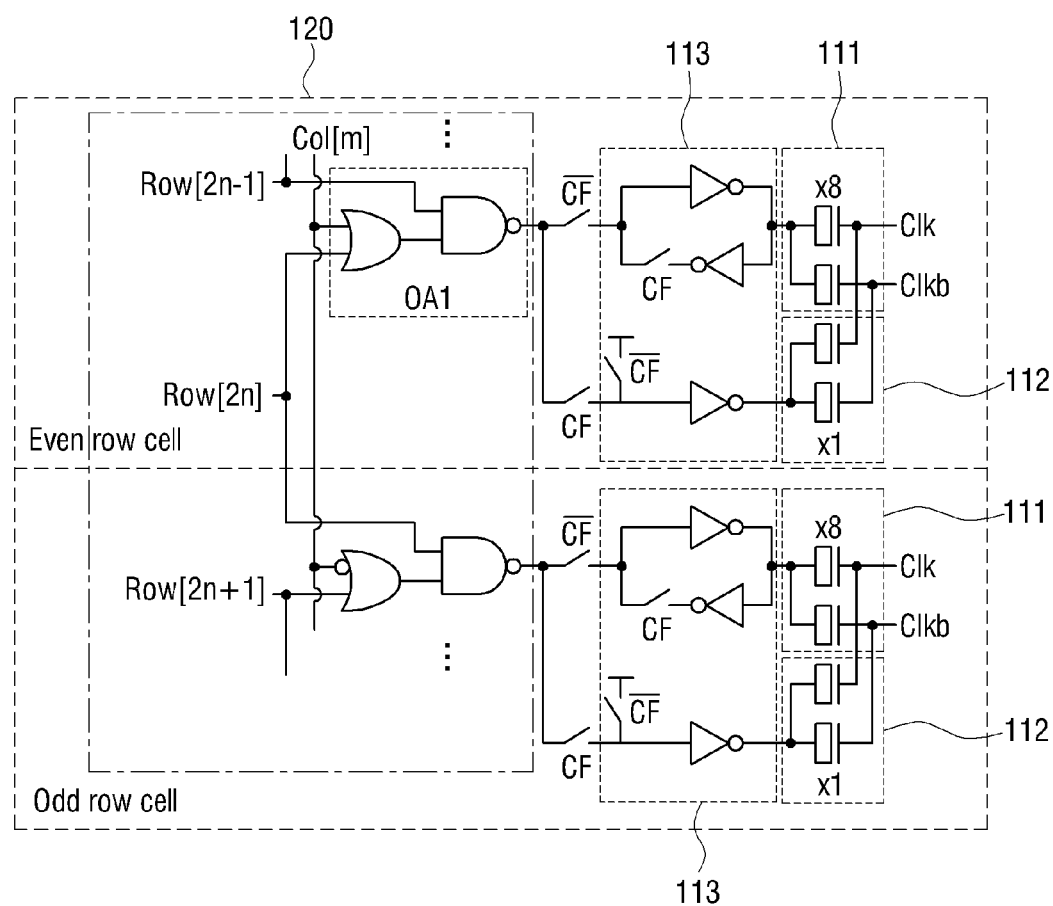
FIG. 4 is a view illustrating an example of the structure of an adjustable capacitor according to another exemplary embodiment of the present invention.

FIG. 4 is a view illustrating an example of the structure of an adjustable capacitor according to another exemplary embodiment of the present invention.

Referring to FIG. 4, the capacitor unit 110 includes 512 (16*32) number of capacitor groups, and those 512 capacitor groups are disposed in a matrix format having 16 columns and 32 rows. Each capacitor group (cell) includes a first capacitor sub-group 111, a second capacitor sub-group 112, and a selection unit 113.

The first capacitor sub-group 111 includes two capacitors having the first capacitance. One end of one capacitor is connected to the first common node (Clk) and the other end is connected to the selection unit 113. One end of the other capacitor is connected to the second common node (Clkb) and the other end is connected to the selection unit 113.

The second capacitor group 112 includes two capacitors having a capacitance different from the first capacitance. One end of one capacitor is connected to the first common node (Clk) and other end is connected to the selection unit 113. One end of the other capacitor is connected to the second common node (Clkb) and the other end is connected to the selection unit 113. In the exemplary embodiment, two capacitors are connected through serial connection in one sub-group, but only one capacitor may be included in a single capacitor sub-group or more than 2 capacitors may be included. In this case, a capacitor may be a varistor.

In the exemplary embodiment, the first capacitance in the first capacitor sub-group 111 is 8 times greater than the capacitance in the second capacitor group 112, but the first capacitance may have different value. The capacitors in the first capacitor sub-group 111 and the capacitors in the second capacitor sub-group 112 may have the same capacitance, and the number of capacitor in the first capacitor sub-group 111 and the number of capacitor in the second capacitor sub-group 112 may be different. In the exemplary embodiment, a single capacitor group includes two capacitor sub-groups, but more than 2 capacitor sub-groups may be used.

The selection unit 113 may alternately connect the first capacitor sub-group 111 and the second capacitor sub-group 112 to a switch element in a switch unit (in the same cell) corresponding to a capacitor group according to an external control signal (CF). Specifically, if the first capacitor sub-group is connected to a switch element in the same capacitor group (cell), the selection unit 113 may disconnect the second capacitor sub-group 112 from a switch element in the same capacitor group (cell). If the second capacitor sub-group 112 is connected to a switch element in the same capacitor group (cell), the selection unit 113 may disconnect the first capacitor sub-group 111 from a switch element in the same capacitor group (cell) while maintaining connection of the first capacitor sub-group corresponding to a selection signal of a capacitor group.

Accordingly, the adjustable capacitor 100 may adjust capacitance in two steps. Specifically, as a first step, the first capacitor sub-group including a relatively greater capacitance value may be selected and its capacitance value may be adjusted by the first capacitance unit, and as a second step, the second capacitor sub-group including a relatively smaller capacitance value may be selected and its capacitance value may be accurately adjusted by the second capacitance unit.

The above operation will be explained in detail with reference to FIGS. 5A and 5B.

Figure 5A:
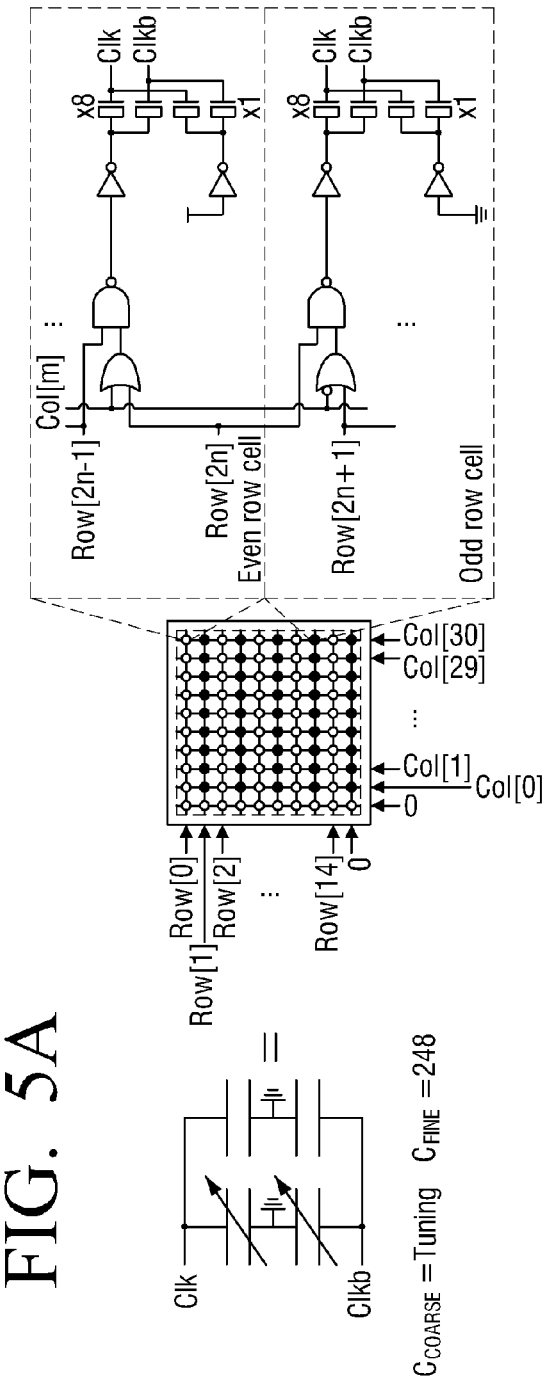
FIG. 5A is a circuit diagram provided to explain an aspect of the operation of the adjustable capacitor in FIG. 4.
Figure 5B:
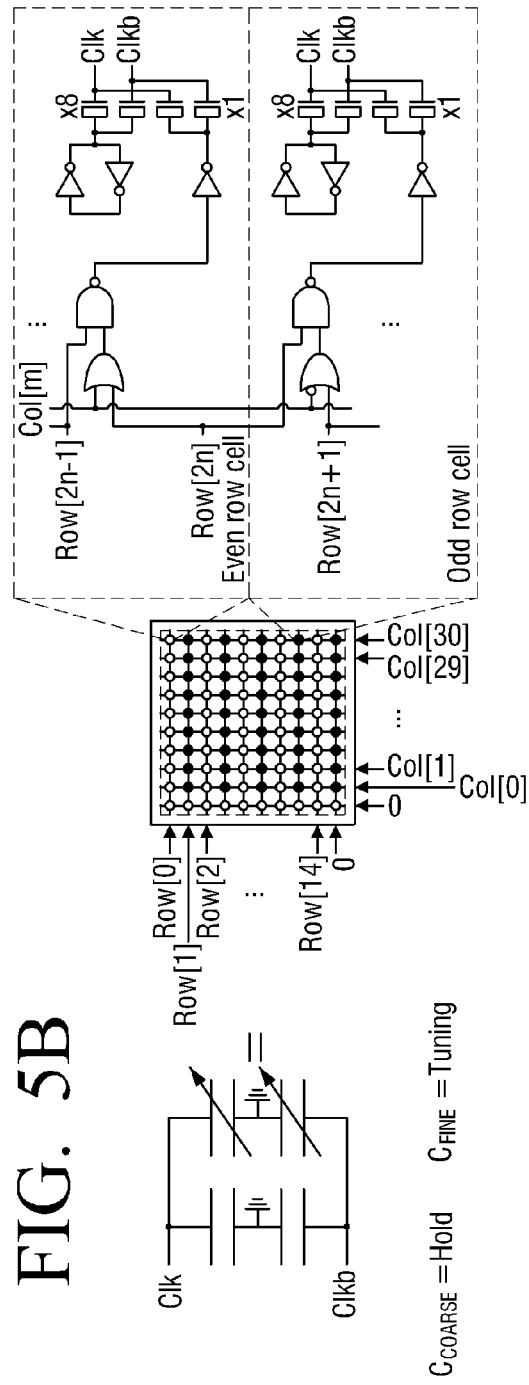
FIG. 5B is a circuit diagram provided to explain another aspect of the operation of the adjustable capacitor in FIG. 4.

FIGS. 5A and 5B are circuit diagrams provided to explain the operation of the adjustable capacitor 100 in FIG. 4. Specifically, FIG. 5A is an equivalent circuit in which an external control signal (CF) '0' is applied to a circuit in FIG. 4 (the first adjustment of a capacitance value), FIG. 5B is an equivalent circuit in which an external control signal (CF) '1' is applied to a circuit in FIG. 4 (the second adjustment of a capacitance value). The external control signal (CF) may be a signal generated by the adjustment unit 130 and may be a signal applied from the outside of the adjustable capacitor 100.

Referring to FIG. 5A, as an external control signal (CF) '0' is applied, the first capacitor sub-group 111 is connected to the switch unit 120 in the same capacitor group (cell), and the second capacitor sub-group 112 is disconnected from the switch unit 120 in the same capacitor group (cell). Accordingly, tuning is performed on the first capacitor sub-group 111. Specifically, if a selection signal of the capacitor group (cell) is applied, the two capacitors in the first capacitor sub-group 111 have a capacitance value with regard to the first common node (Clk) and the second common node (Clkb). If a selection signal of the capacitor group (cell) is not applied, the two capacitors in the first capacitor sub-group 111 does not have a capacitance value with regard to the first common node (Clk) and the second common node (Clkb).

Referring to FIG. 5B, as an external control signal (CF) '1' is applied, the first capacitor sub-group 111 is disconnected from the switch unit 120 in the same capacitor group (cell), and the second capacitor sub-group 112 is connected to the switch unit 120 in the same capacitor group (cell). Accordingly, tuning is performed on the second capacitor sub-group 112. Specifically, if a selection signal of the capacitor group (cell) is applied, the two capacitors in the second capacitor sub-group 112 have a capacitance value with regard to the first common node (Clk) and the second common node (Clkb). If a selection signal of the capacitor group (cell) is not applied, the two capacitors in the second capacitor sub-group 112 does not have a capacitance value with regard to the first common node (Clk) and the second common node (Clkb).

In this case, the first capacitor sub-group 111 maintains connection state at the timing of tuning Specifically, as one end of the first capacitor sub-group 111 is connected to an inverter in a loop, the connection is maintained even if tuning is performed on the second capacitor sub-group 112. For instance, if the first capacitor sub-group 111 has the first capacitance value with regard to the first common node (Clk) and the second common node (Clkb), the first capacitance value regarding the first common node (Clk) and the second common node (Clkb) is maintained, and if the first capacitor sub-group 111 does not have a capacitance value with regard to the first common node (Clk) and the second common node (Clkb), the state of having no capacitance value is maintained.

While describing FIG. 1 to FIG. 5B, it is explained that a plurality of capacitor groups in a matrix have the same form, but an adjustable capacitor may be realized using a capacitor having different capacitance values for each row in a matrix, and using a capacitor having different capacitance values for each column. As illustrated in FIG. 5, the range of a capacitance value may be restricted as a selection signal is applied continuously with regard to a single row and a single column.

Figure 6:
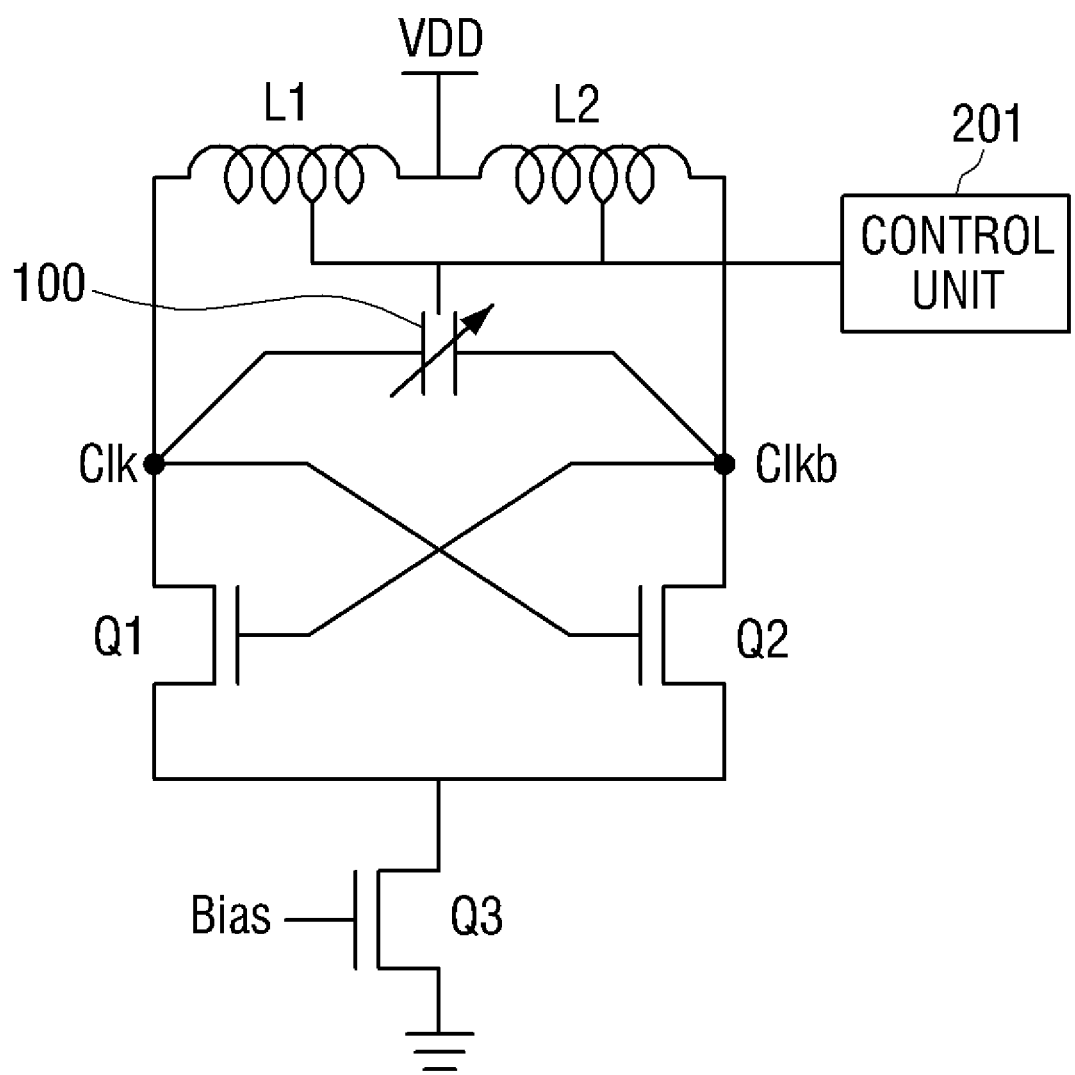
FIG. 6 is a block diagram illustrating the structure of a digitally controlled oscillator according to an exemplary embodiment of the present invention.

FIG. 6 is a view illustrating the structure of a digitally controlled oscillator 200 according to an exemplary embodiment of the present invention.

Referring to FIG. 6, the digitally controlled oscillator 200 includes an adjustable inductor L1, L2, the adjustable capacitor 100, and a control unit 201.

The adjustable capacitor 100 may adjust capacitance by selectively connecting a plurality of capacitor groups aligned in a matrix format in parallel. The adjustable capacitor 100 may be connected to the inductor L1, L2 in parallel to form a LC resonant circuit and generate oscillation frequency. The adjustable capacitor 100 may be realized as illustrated in FIG. 2 or FIG. 4.

The control unit 201 may adjust oscillation frequency by adjusting capacitance of the adjustable capacitor 100 and inductance of the inductor L1, L2. Specifically, the control unit 201 may calculate required capacitance size for oscillation frequency, select a plurality of capacitor groups connected in parallel, and generate a selection signal of the column and row of a matrix corresponding to the selected plurality of capacitor groups. The control unit may select a plurality of capacitor groups to be connected in parallel randomly.

If the plurality of capacitor groups in the adjustable capacitor 100 include the first capacitor sub-group and the second capacitor sub-group, the control unit 201 may adjust connection state of a capacitor in the first capacitor sub-group to adjust oscillation frequency greatly, and may adjust connection state of a capacitor in the second capacitor sub-group to accurately adjust oscillation frequency and output it. The control unit may provide a selection signal (CF) to select each sub-group to the adjustable capacitor 100.

Figure 7:
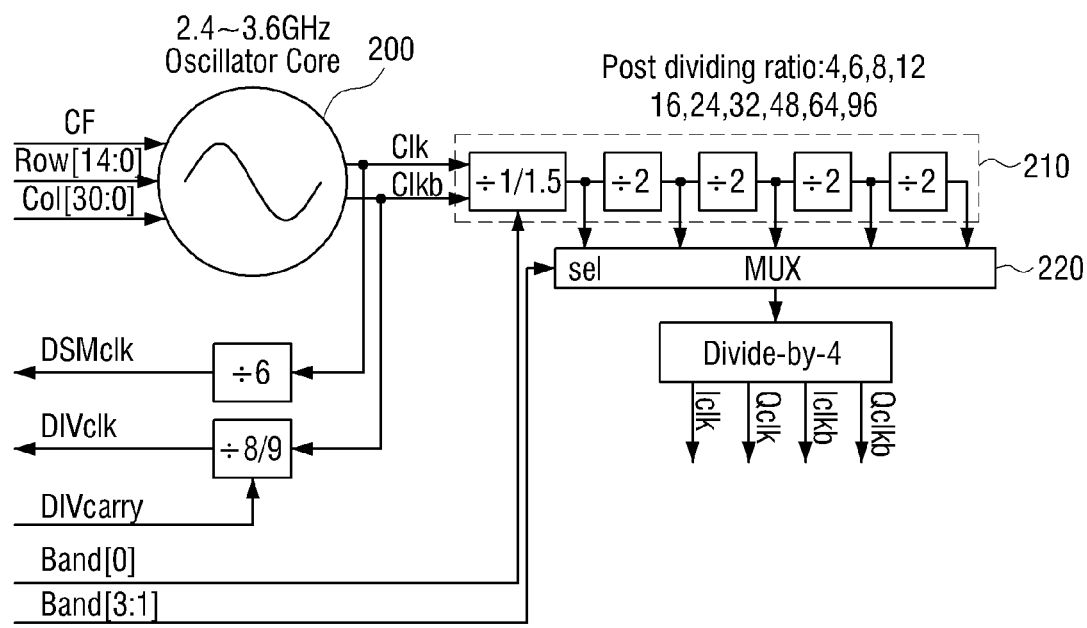
FIG. 7 is a block diagram illustrating the structure of a digitally controlled oscillator according to another exemplary embodiment of the present invention.

FIG. 7 is a block diagram illustrating the structure of a digitally controlled oscillator according to another exemplary embodiment of the present invention.

Referring to FIG. 7, in the digitally controlled oscillator 300, a plurality of dividers 210 are additionally connected to the digitally controlled oscillator 200 illustrated in FIG. 6.

The plurality of dividers 210 may divide the oscillation frequency generated by the digitally controlled oscillator 200 into at least one of 4, 6, 8, 12, 16, 24, 32, 64, and 96 divisions and output it. Specifically, in the plurality of dividers 210, four 2-dividers are connected to a 1/1.5 divider through serial connection, and the output of each divider is input to a MUX 220. Therefore, a signal of a band range corresponding to an external selection signal is finally output. Accordingly, the digitally controlled oscillator 300 of the present invention may generate oscillation signals for various frequency bands.

Figure 8:
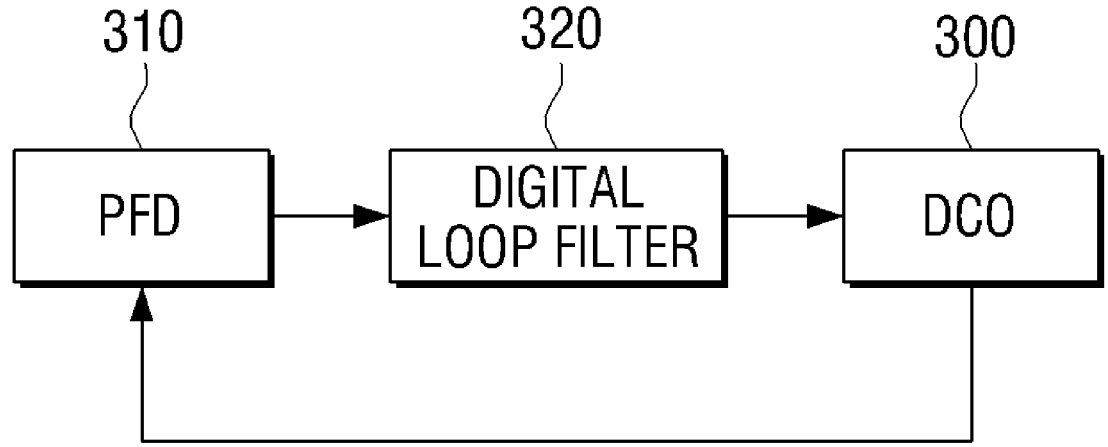
FIG. 8 is a block diagram illustrating the structure of an all-digital phase locked loop according to an exemplary embodiment of the present invention.

FIG. 8 is a block diagram illustrating the structure of an all-digital phase locked loop according to an exemplary embodiment of the present invention.

Referring to FIG. 8, the all-digital phase locked loop 1000 includes a digitally controlled oscillator 300, a phase frequency detector 310, and a digital loop filter 320.

The digitally controlled oscillator 300 may adjust oscillation frequency by changing connection state of a plurality of capacitor groups aligned in a matrix format. Specifically, the digitally controlled oscillator 300 may include an inductor, an adjustable capacitor, and a control unit, and may be realized as illustrated in FIG. 6 or FIG. 7.

The phase frequency detector 310 may compare oscillation frequency output by a digitally controlled oscillator with standard frequency, and detect phase difference and frequency difference between the two frequencies. Specifically, the phase frequency detector 310 may receive oscillation frequency output from the digitally controlled oscillator 300 and compare it with standard frequency to detect phase difference and frequency difference. The phase frequency detector 310 may be a digital-based circuit, but a conventional analog-based phase frequency detector may be used.

The digital loop filter 320 may provide a digital control signal of the digitally controlled oscillator 300 based on the detected frequency difference and phase difference.

Figure 9:
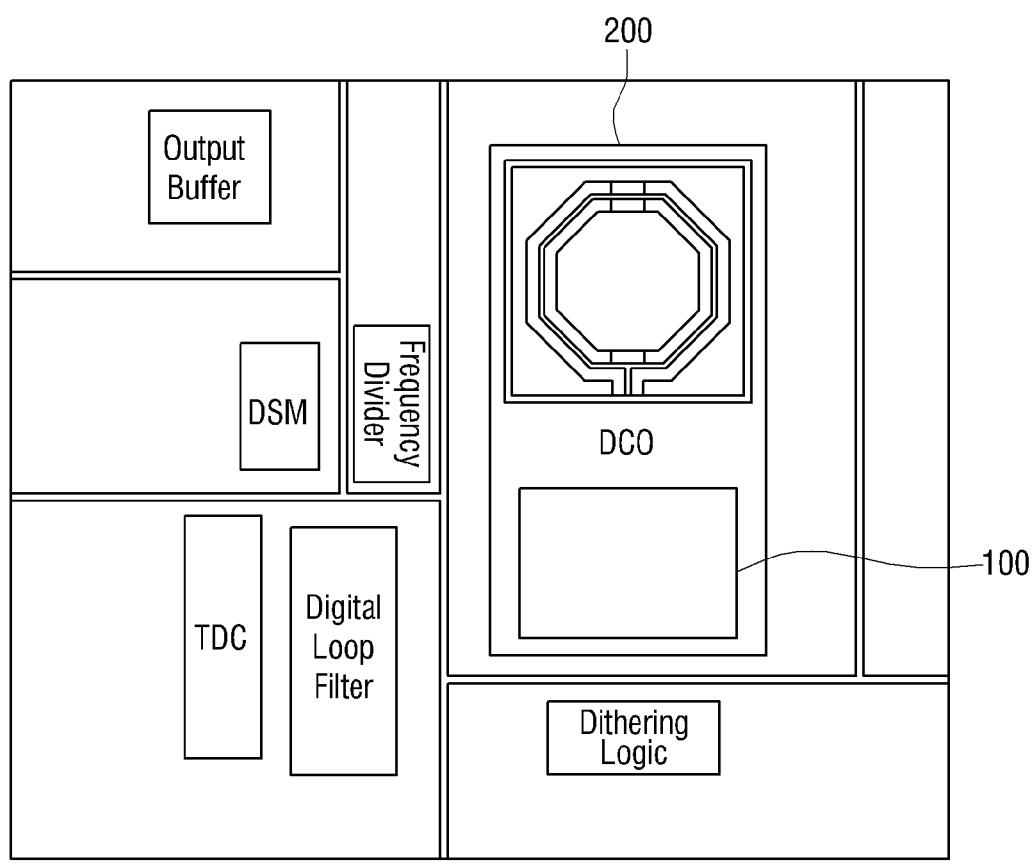
FIG. 9 is a view illustrating a chip layout of the all-digital phase locked loop in FIG. 8.

FIG. 9 is a view illustrating a chip layout of the all-digital phase locked loop in FIG. 8. As illustrated in FIG. 9, the all-digital phase locked loop, according to the exemplary embodiment of the present invention, has a high capacitance change rate, and thus may be able to support broad band and may also be realized as a single LC circuit, minimizing its size.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An adjustable capacitor, comprising:
   a capacitor unit comprising a plurality of capacitor groups arranged in a matrix format; and
   a switch unit which adjusts the capacitance of the capacitor unit by connecting at least two capacitor groups of the plurality of capacitor groups in parallel according to a selection signal,
   wherein the selection signal indicates a column and row information of the at least two capacitors according to the matrix format, and
   wherein each capacitor group comprises:
      a first capacitor having a first end connected to a first common node and a second end connected to a switch; and
      a second capacitor which is smaller than the first capacitor having a first end connected to a second common node and a second end connected to the switch,
   wherein capacitance of the capacitor group is adjusted by controlling the combination of the first capacitor and the second capacitor according to an external control signal.

2. The adjustable capacitor as claimed in claim 1, further comprising:
   an adjustment unit which selects which capacitor groups of the plurality of capacitor groups are to be connected in parallel according to a required capacitance size and generates the selection signal.

3. An adjustable capacitor, comprising:
   a capacitor unit comprising a plurality of capacitor groups arranged in a matrix format; and
   a switch unit which adjusts the capacitance of the capacitor unit by connecting at least two capacitor groups of the plurality of capacitor groups in parallel according to a selection signal,
   wherein the selection signal indicates a column and row information of the at least two capacitors according to the matrix format, and
   wherein each capacitor group comprises:
      a first capacitor sub-group comprising first and second capacitors having a first capacitance, wherein a first end of the first capacitor is connected to a first common node and a second end of the first capacitor is connected to a selection unit and wherein a first end of the second capacitor is connected to a second common node and a second end of the second capacitor is connected to the selection unit;
      a second capacitor sub-group comprising first and second capacitors having a second capacitance different from the first capacitance, wherein a first end of the first capacitor is connected to the first common node and a second end of the first capacitor is connected to the selection unit and wherein a first end of the second capacitor is connected to the second common node and a second end of the second capacitor is connected to the selection unit; and
   wherein the selection unit alternately connects the first capacitor sub-group and the second capacitor sub-group with a switch element of the switch unit corresponding to the capacitor group according to an external control signal.

4. The adjustable capacitor as claimed in claim 3, wherein the selection unit disconnects the second capacitor sub-group from the switch element if the first capacitor sub-group is connected to the switch, and disconnects the first capacitor sub-group from the switch element if the second capacitor sub-group is connected to the switch element while maintaining connection of the first capacitor sub-group corresponding to a selection signal with respect to the capacitor group.

5. The adjustable capacitor as claimed in claim 3, further comprising:
   an adjustment unit which selects which capacitor groups of the plurality of capacitor groups are to be connected in parallel according to a required capacitance size and generates the selection signal.

6. A digitally controlled oscillator, comprising:
   an inductor;
   an adjustable capacitor comprising a plurality of capacitor groups arranged in a matrix format in which capacitance is adjusted by selectively connecting in parallel at least two capacitor groups of the plurality of capacitor groups; and
   a control unit which controls an oscillation frequency of the digitally controlled oscillator by adjusting the capacitance of the adjustable capacitor,
   wherein the control unit adjusts the capacitance by providing the adjustable capacitor a column and row information of the at least two capacitor groups according to the matrix form, and
   wherein each capacitor group comprises:
      a first capacitor having a first end connected to a first common node and a second end connected to a switch; and
      a second capacitor which is smaller than the first capacitor having a first end connected to a second common node and a second end connected to the switch, and
   wherein capacitance of the capacitor group is adjusted by controlling the combination of the first capacitor and the second capacitor according to an external control signal.

7. The digitally controlled oscillator as claimed in claim 6, wherein the inductor is an adjustable inductor and the control unit further controls the oscillation frequency of the digitally controlled oscillator by adjusting the inductance of the adjustable inductor.

8. The digitally controlled oscillator as claimed in claim 6, wherein the control unit selects which capacitor groups of the plurality of capacitor groups are to be connected in parallel according to a required capacitance size and generates a selection signal to provide the adjustable capacitor the column and row information of the selected capacitor groups according to the matrix format.

9. A digitally controlled oscillator, comprising:
an inductor;
an adjustable capacitor comprising a plurality of capacitor groups arranged in a matrix format in which capacitance is adjusted by selectively connecting in parallel at least two capacitor groups of the plurality of capacitor groups; and
a control unit which controls an oscillation frequency of the digitally controlled oscillator by adjusting the capacitance of the adjustable capacitor,
wherein the control unit adjusts the capacitance by providing the adjustable capacitor a column and row information of the at least two capacitor groups according to the matrix form, and
wherein each capacitor group comprises:
a first capacitor sub-group comprising first and second capacitors having a first capacitance, wherein a first end of the first capacitor is connected to a first common node and a second end of the first capacitor is connected to a selection unit and wherein a first end of the second capacitor is connected to a second common node and a second end of the second capacitor is connected to the selection unit;
a second capacitor sub-group comprising first and second capacitors having a second capacitance different from the first capacitance, wherein a first end of the first capacitor is connected to the first common node and a second end of the first capacitor is connected to the selection unit and wherein a first end of the second capacitor is connected to the second common node and a second end of the second capacitor is connected to the selection unit:
wherein the selection unit alternately connects the first capacitor sub-group and the second capacitor sub-group with a switch element corresponding to the capacitor group.

10. The digitally controlled oscillator as claimed in claim 9, wherein the selection unit disconnects the second capacitor sub-group from the switch element if the first capacitor sub-group is connected to the switch, and disconnects the first capacitor sub-group from the switch element if the second capacitor sub-group is connected to the switch element while maintaining connection of the first capacitor sub-group corresponding to a selection signal with respect to the capacitor group.

11. The digitally controlled oscillator as claimed in claim 9, wherein the control unit selects which capacitor groups of the plurality of capacitor groups are to be connected in parallel according to a required capacitance size and generates a selection signal to provide the adjustable capacitor the column and row information of the selected capacitor groups according to the matrix format.

12. An all-digital phase locked loop, comprising:
a digitally controlled oscillator to adjust oscillation frequency by changing a connection state of a plurality of capacitor groups arranged in a matrix format;
a detection unit to compare oscillation frequency output from the digitally controlled oscillator with a standard frequency, and detect a phase difference and a frequency difference between the oscillation frequency and the standard frequency; and
a digital loop filter to provide a digital control signal with respect to the digitally controlled oscillator based on the detected phase difference and the detected frequency difference,
wherein the digital control signal provides a column and row information of the plurality of capacitor groups according to the matrix format to adjust the connection state of the plurality of capacitor groups, and
wherein each capacitor group comprises:
a first capacitor having a first end connected to a first common node and a second end connected to a switch; and
a second capacitor which is smaller than the first capacitor having a first end connected to a second common node and a second end connected to the switch, and
wherein capacitance of the capacitor group is adjusted by controlling the combination of the first capacitor and the second capacitor according to an external control signal.

13. The all-digital phase locked loop as claimed in claim 12, wherein the digitally controlled oscillator comprises:
an inductor;
an adjustable capacitor comprising the plurality of capacitor groups in which capacitance is adjusted by selectively connecting in parallel at least two capacitor groups of the plurality of capacitor groups according to a selection signal; and
a control unit which controls an oscillation frequency of the digitally controlled oscillator by adjusting the capacitance of the adjustable capacitor according to the digital control signal.

14. The all-digital phase locked loop as claimed in claim 13, wherein the inductor is an adjustable inductor and the control unit further controls the oscillation frequency of the digitally controlled oscillator by adjusting the inductance of the adjustable inductor.

15. The all-digital phase locked loop as claimed in claim 12, wherein the control unit selects which capacitor groups of the plurality of capacitor groups are to be connected in parallel according to the digital control signal and generates a selection signal to provide the adjustable capacitor the column and row information of the selected capacitor groups according to the matrix format.

16. An all-digital phase locked loop, comprising:
a digitally controlled oscillator to adjust oscillation frequency by changing a connection state of a plurality of capacitor groups arranged in a matrix format;
a detection unit to compare oscillation frequency output from the digitally controlled oscillator with a standard frequency, and detect a phase difference and a frequency difference between the oscillation frequency and the standard frequency; and
a digital loop filter to provide a digital control signal with respect to the digitally controlled oscillator based on the detected phase difference and the detected frequency difference,
wherein the digital control signal provides a column and row information of the plurality of capacitor groups accordingto the matrix format to adjust the connection state of the plurality of capacitor groups, and
wherein the capacitor group comprises:
a first capacitor sub-group comprising first and second capacitors having a first capacitance, wherein a first end of the first capacitor is connected to a first common node and a second end of the first capacitor is connected to a selection unit and wherein a first end of the second capacitor is connected to a second common node and a second end of the second capacitor is connected to the selection unit;
a second capacitor sub-group comprising first and second capacitors having a second capacitance different from a first capacitor, wherein a first end of the first capacitor is connected to the first common node and a second end of the first capacitor is connected to the selection unit and wherein a first end of the second capacitor is connected to the second common node and a second end of the second capacitor is connected to the selection unit;

wherein the selection unit alternately connects the first capacitor sub-group and the second capacitor sub-group with a switch element corresponding to the capacitor group.

17. The all-digital phase locked loop as claimed in claim 16, wherein the selection unit disconnects the second capacitor sub-group from the switch element if the first capacitor sub-group is connected to the switch, and disconnects the first capacitor sub-group from the switch element if the second capacitor sub-group is connected to the switch element while maintaining connection of the first capacitor sub-group corresponding to a selection signal with respect to the capacitor group.

18. The all-digital phase locked loop as claimed in claim 16, wherein the control unit selects which capacitor groups of the plurality of capacitor groups are to be connected in parallel according to the digital control signal and generates a selection signal to provide the adjustable capacitor the column and row information of the selected capacitor groups according to the matrix format.

* * * * *